United States Patent
Perez-Uria et al.

(10) Patent No.: US 9,253,936 B2
(45) Date of Patent: Feb. 2, 2016

(54) METHOD FOR MOUNTING CONNECTION PINS IN A COMPONENT CARRIER, A DIE TOOL FOR MOUNTING CONNECTION PINS, A COMPONENT CARRIER FORMING A MODULE FOR AN ELECTRONIC ASSEMBLY, AND SUCH AN ASSEMBLY

(75) Inventors: Igor Perez-Uria, Järfälla (SE); Ola Arvidsson, Kalmar (SE)

(73) Assignee: Telefonaktiebolaget L M Ericsson, Stockholm (SE)

( * ) Notice: Subject to any disclaimer, the term of this patent is extended or adjusted under 35 U.S.C. 154(b) by 214 days.

(21) Appl. No.: 14/000,365

(22) PCT Filed: Feb. 25, 2011

(86) PCT No.: PCT/SE2011/050223
§ 371 (c)(1),
(2), (4) Date: Aug. 19, 2013

(87) PCT Pub. No.: WO2013/115556
PCT Pub. Date: Aug. 30, 2012

(65) Prior Publication Data
US 2013/0343007 A1     Dec. 26, 2013

(51) Int. Cl.
*H05K 7/00*     (2006.01)
*H05K 13/04*    (2006.01)
(Continued)

(52) U.S. Cl.
CPC ............. *H05K 13/04* (2013.01); *H05K 1/181* (2013.01); *H05K 3/325* (2013.01);
(Continued)

(58) Field of Classification Search
USPC .............. 361/803, 728–730, 792; 439/79, 82, 439/751, 873; 174/260–262
See application file for complete search history.

(56) References Cited

U.S. PATENT DOCUMENTS

| | | | |
|---|---|---|---|
| 2,814,024 A | 11/1957 | Narozny | |
| 3,123,664 A | 3/1964 | Logan et al. | |

(Continued)

FOREIGN PATENT DOCUMENTS

| | | |
|---|---|---|
| DE | 44 22 876 A1 | 1/1995 |
| GB | 2 006 550 A | 5/1979 |

(Continued)

OTHER PUBLICATIONS

International Search Report, PCT/SE2011/050223, Sep. 7, 2011.
(Continued)

*Primary Examiner* — Hung S Bui
(74) *Attorney, Agent, or Firm* — Patents on Demand, P.A.; Brian K. Buchheit; Scott M. Garrett

(57) ABSTRACT

A method for mounting connection pins in respective through-holes. Each pin having an anchoring part for insertion into said through-hole, a contact part to extend outside said through-hole and having a contact end for contact with the surface of another module of the electronic assembly, and a flange part to abut against said component carrier and located between said anchoring part and said contact part. A die tool has several similar recesses all adapted to receive a contact end of the contact part of a connection pin. The anchoring part of the pin is inserted in a through-hole of the component carrier, and the pin is anchored in the component carrier by exerting a force on a free end of the anchoring part of the pin while an end surface of the contact end abuts the bottom surface of similar recesses in the die tool.

17 Claims, 4 Drawing Sheets

(51) Int. Cl.
*H05K 3/32* (2006.01)
*H05K 1/18* (2006.01)
*H05K 3/30* (2006.01)
*H05K 3/34* (2006.01)

(52) U.S. Cl.
CPC ........... *H05K 13/0447* (2013.01); *H05K 3/301* (2013.01); *H05K 3/3447* (2013.01); *H05K 2201/1059* (2013.01); *H05K 2201/10303* (2013.01); *H05K 2201/10871* (2013.01); *H05K 2203/0195* (2013.01); *Y10T 29/49147* (2015.01); *Y10T 29/53209* (2015.01)

(56) References Cited

U.S. PATENT DOCUMENTS

| | | | |
|---|---|---|---|
| 3,416,122 | A | 12/1968 | Kinkaid |
| 3,832,603 | A | 8/1974 | Cray et al. |
| 4,186,982 | A | 2/1980 | Cobaugh et al. |
| 4,420,877 | A | 12/1983 | McKenzie, Jr. |
| 4,660,922 | A | 4/1987 | Cooney et al. |
| RE32,540 | E | 11/1987 | Murphy |
| 4,906,198 | A | 3/1990 | Cosimano et al. |
| 5,046,971 | A | 9/1991 | Ruggiero et al. |
| 5,456,608 | A * | 10/1995 | Rogers et al. ................ 439/48 |
| 5,480,309 | A | 1/1996 | Arisaka |
| 5,915,999 | A | 6/1999 | Takenaka et al. |
| 6,217,346 | B1 * | 4/2001 | Cubon ........................... 439/78 |
| 6,384,341 | B1 * | 5/2002 | Rothermel et al. ........... 174/255 |
| 6,545,890 | B2 * | 4/2003 | Pitzele ......................... 363/147 |
| 6,818,839 | B2 | 11/2004 | Hosaka et al. |
| 7,025,604 | B2 * | 4/2006 | Fronk ............................. 439/75 |
| 7,377,823 | B2 * | 5/2008 | Chen ............................ 439/751 |
| 8,324,642 | B2 * | 12/2012 | Grajcar .......................... 257/98 |
| 2004/0137803 | A1 | 7/2004 | Pitzele |
| 2007/0093143 | A1 * | 4/2007 | Nomura ....................... 439/751 |
| 2008/0207015 | A1 | 8/2008 | Sueyoshi |
| 2008/0265398 | A1 | 10/2008 | Matsumoto et al. |
| 2009/0298312 | A1 | 12/2009 | Gueckel |
| 2011/0207363 | A1 | 8/2011 | Shimizu |
| 2012/0088381 | A1 | 4/2012 | Wild et al. |
| 2013/0330966 | A1 | 12/2013 | Perez-Uria et al. |

FOREIGN PATENT DOCUMENTS

| | | |
|---|---|---|
| JP | 6-84550 | 3/1994 |
| JP | 06084550 A | 3/1994 |
| WO | WO 2007/008264 A1 | 1/2007 |

OTHER PUBLICATIONS

Written Opinion of the International Searching Authority, PCT/SE2011/050223, Sep. 7, 2011.
International Search Report, PCT PCT/SE2011/050221, Jun. 29, 2011.
Written Opinion of the International Searching Authority, PCT/SE2011/050221, Jun. 29, 2011.
"L'insertion a force dans les circuits imprimes" Toute L'electronique, Societe Des Editions Radio. Paris, FR, No. 551, Feb. 1, 1990; XP000095549, pp. 34-37. No Translation Available.
International Search Report, PCT/SE2011/050222, Jun. 29, 2011.
Written Opinion of the International Searching Authority, PCT/SE2011/050222, Jun. 29, 2011.
International Preliminary Report on Patentability, PCT/SE2011/050222, Jul. 2, 2013.
Communication pursuant to Article 94(3) EPC, European Application No. 11 715 082.1, Mar. 24, 2015.

* cited by examiner

METHOD FOR MOUNTING CONNECTION PINS IN A COMPONENT CARRIER, A DIE TOOL FOR MOUNTING CONNECTION PINS, A COMPONENT CARRIER FORMING A MODULE FOR AN ELECTRONIC ASSEMBLY, AND SUCH AN ASSEMBLY

CROSS REFERENCE TO RELATED APPLICATION

This application is a 35 U.S.C. §371 national stage application of PCT International Application No. PCT/SE2011/050223, filed on 25 Feb. 2011, the disclosure and content of which is incorporated by reference herein in its entirety. The above-referenced PCT International Application was published in the English language as International Publication No. WO 2012/115556 A1 on 30 Aug. 2012.

TECHNICAL FIELD OF THE INVENTION

The present invention relates to a method for mounting connection pins in respective through-holes provided in a component carrier for an electronic assembly, a die tool for mounting connection pins in the component carrier, and a corresponding component carrier forming a module for an electronic assembly. The invention also relates to an electronic assembly.

BACKGROUND OF THE INVENTION

In the electronics industry, connection pins are widely used to provide connection between different parts of an electronic assembly. The connection pins are e.g. mounted in a through-hole in a component carrier or they are surface mounted to a component carrier, which component carrier can have different applications and/or combinations thereof, such as: the component carrier can be part of a printed circuit board, it can carry electronic components and form a component board, it can carry modules such as power modules or stackable modules comprising different components, it can be part of a motherboard etc., all of which can form, or be parts or modules of an electronic assembly. The connection pins usually provide both mechanical connection between the parts of the assembly, as well as electrical connection. There exists a number of known assembly techniques for anchoring a connection pin in or to a component carrier, such as wave soldering, surface mounted pin in solder paste, press-fit, rivet/clinching, etc. The chosen technique mostly depends on the application in which the component carrier is used and the requirements involved.

When using a press-fit assembly technique, the component carrier is provided with a through-hole into which an end portion of the connection pin is to be inserted. The through-hole is slightly narrower than the end portion of the connection pin, and the connection pin has to be inserted into the through-hole by force, thereby achieving a press-fit of the connection pin in the through-hole. The interior wall of the through-hole and/or the press-fit portion of the connection pin are subject to deformation. The connection pin may have a press-fit portion that has a special design in order to facilitate deformation. Examples of such connection pins adapted for press-fit are found in WO 2007/008264 and US 2009/0298312.

According to another known assembly technique, the connection pin has an end portion adapted to be inserted in a through-hole in a component carrier, which end portion is slightly narrower than the size of the through-hole. The connection between the connection pin in the through-hole and the component carrier is achieved by dispensing solder paste in the through-hole, or at the opening of the through-hole, and soldering the connection pin to the component carrier.

According to another known assembly technique, the connection pin may be designed as a rivet and will then be anchored to the component carrier by riveting to the component carrier. In order to provide electrical connection between the component carrier and the connection pin, the connection pin is usually also soldered to the component carrier.

In many applications, each connection pin is anchored to a component carrier via one of its ends, and the other end of the connection pin is intended to be mounted on the surface of another module in the electronic assembly, such as another component carrier, a printed circuit board (PCB), a motherboard, a component board, etc. Whenever such surface mounting is used, one important factor is the tolerances between the different parts. For example, the tolerance related to the distance between the end of each pin facing the surface on which it is to be mounted and the surface itself, is crucial if successful mounting is to be achieved. Since the surface of the module on which the component carrier with its pins is to be mounted generally has a high degree of planarity or flatness, the corresponding end surfaces of the connection pins must also represent a common surface with a high degree of planarity/flatness, or in other words, a high degree of co-planarity of the end surfaces. However, this can be a problem, often due to the fact that the anchoring of the pins in the through-hole of the component carrier nearly always involves some sort of deformation of the pin or the through-hole and/or the component carrier. Also the assembly technique of soldering the pin in a through-hole can result in lack of sufficient co-planarity. Other reasons for irregularities in the planarity of the component carrier can be irregularities that existed already in the original component carrier as such, or in the case of the component carrier being a PCB there may be irregularities that occurred during printing of the circuit pattern. A typical failure in electronic assemblies as described above occurs when the lack of co-planarity of the connection pins of a mounted device, such as a component carrier, impedes the soldering of an intended mating surface which will result in an air gap and lack of electrical connection between the pin with its device and the mating surface.

SUMMARY OF THE INVENTION

The object of the present invention is to improve surface mounting technology.

This object is achieved by means of a method for mounting connection pins in respective through-holes provided in a component carrier forming a module for an electronic assembly, each pin having an anchoring part for insertion into said through-hole, a contact part adapted to extend outside said through-hole and having a contact end adapted for contact with the surface of another module of the electronic assembly, and a flange part adapted to abut against said component carrier and located between said anchoring part and said contact part, comprising
providing a die tool having several similar recesses all adapted to receive a contact end of the contact part of a connection pin, and all recesses having a bottom surface with a high hardness sufficient enough to withstand a force exerted on the connection pin during mounting of the connection pin in the component carrier without any deformation of the surface, and the bottom surfaces of all of the recesses having a high level of co-planarity adapted to predetermined requirements for the connection pins, and for each pin:

locating the contact end of the contact part of the pin in a recess provided in a die tool, said die tool having several similar recesses all adapted to receive a contact end of the contact part of a connection pin, —inserting the anchoring part of the pin in a through-hole of the component carrier, and anchoring the pin in the component carrier by exerting a force on a free end of the anchoring part of the pin while an end surface of the contact end of the contact part abuts a bottom surface of the recess in the die tool.

Through this method, and the use of the die tool, is obtained the advantage that all connection pins mounted simultaneously in a component carrier will have contact ends with end surfaces with a high level of co-planarity inbetween them. This will make it possible to reduce the tolerances related to surface mounting of a component carrier, in relation the intended mating surface. For example, when the intended mating surface is the surface of a printed circuit board, the solder layer of the PCB pattern may be made thinner and still a reliable connection can be obtained. A thinner solder layer will also make it possible to surface mount components with lesser distance between the components and also use components with a finer pitch (leg distance).

Moreover, the advantage is achieved that any unevenness or irregularities in the planarity of the component carrier, e.g. irregularities that existed already in the original component carrier as such or irregularities resulting from deformation of the component carrier during the anchoring of the connection pins in the component carrier, do not transplant into a low level of co-planarity of the end surfaces of the connection pins. Instead, these irregularities are compensated for where the connection pin is anchored in the component carrier. This will also facilitate the use of component carriers that are comprised of many layers in a sandwich construction, such as substrates, which can sometimes have a slightly curved shape.

To continue, the anchoring of the pin in the component carrier may be achieved by deforming the anchoring part of the pin in the through-hole and thereby achieving a press fit of the pin in the through-hole. As is clear to the skilled person, the anchoring of the connection pin in the component carrier may be achieved in many different ways, while involving the exertion of a force on a free end of the anchoring part of the pin and while an end surface of the contact end of the contact part abuts the bottom surface of the recess in the die tool, thus having a function similar to an anvil, for example by riveting or clinching, or press fitting of the pin. An example of a possible connection pin is found in our parallel PCT patent application, filed on the same date as the present patent application, and having the title "A connection pin and a method for mounting a connection pin in a component carrier for an electronic assembly, and such a component carrier comprising connection pins".

The method according to the present invention may comprise mounting all of the connection pins of a component carrier at the same time by simultaneously exerting a force on the free ends of the anchoring parts of all of the connection pins, while having their respective contact ends of the contact part of the pin located in a corresponding recess of the die tool. It is naturally an advantage to be able to mount all of the connection pins at the same time. This will speed up the mounting process and save costs.

According to another aspect, the present invention relates to a die tool adapted for mounting connection pins in respective through-holes provided in a component carrier forming a module for an electronic assembly, for use in the method according to any one of the claims related to the method. The die tool comprises a die having several similar recesses all adapted to receive a contact end of the contact part of a connection pin, all recesses having a bottom surface with a high hardness sufficient enough to withstand a force exerted during anchoring of the pin in the component carrier without any deformation of the surface, and the bottom surfaces of all of the recesses having a high level of co-planarity adapted to predetermined requirements for the connection pins. This die tool makes it possible to employ the method defined above and benefit from its advantages.

Further, the high level of co-planarity of the bottom surfaces of all of the recesses may involve a maximum difference of 0.15 mm between the bottom surface of any one recess and the bottom surface of any other recess.

The level of co-planarity of the bottom surfaces of all of the recesses of the die tool may have an even lesser difference of 0.10 mm, or less, e.g. 0.09 mm, 0.08 mm, 0.05 mm or even less. In order to obtain a high percentage of approved connection pins (or component carriers with mounted connection pins), i.e. within a prescribed tolerance limit or co-planarity requirement, the demands on the tolerance of the co-planarity of the bottom surfaces of the recesses is normally set higher than the tolerance for the connection pins. For example 1.5-2 times the tolerance of the connection pin, where twice as high is half the tolerance.

Further, the recess may have a depth and shape adapted to the shape of the contact end of the connection pin, such that the recess serves as a guiding means for the contact end during the anchoring operation of the connection pin in the component carrier.

According to one embodiment, there is at least provided one recess in the die tool for each connection pin of the component carrier on which the tool is to be used and each such recess in the die tool is located in correspondence with the location of a corresponding connection pin of the component carrier.

According to another aspect of the present invention is defined a component carrier forming a module for an electronic assembly, provided with connection pins mounted in respective through-holes provided in the component carrier, each pin having an anchoring part inserted into said through-hole, a contact part extending outside said through-hole and having a contact end adapted for contact with the surface of another module of the electronic assembly, and a flange part adapted to abut against said component carrier and located between said anchoring part and said contact part, characterized in that the end surfaces of the connection pins form a common plane having a level of co-planarity with a maximum difference of 0.15 mm between an end surface of any one connection pin and an end surface of any other connection pin mounted in the component carrier.

It is also possible to have a lesser difference in the level of co-planarity between the end surfaces of the connection pins, such as a maximum difference of 0.10 mm, or even 0.09 mm, 0.08 mm or less.

Finally, according to a further aspect of the invention is defined an electronic assembly comprising a motherboard forming a first module, and a component carrier as defined above, forming a second module and mounted on the surface of the motherboard.

In order to clarify the meaning of certain terms used in this description, the following definitions are offered:

Component carrier in the present context shall be interpreted to include, but without any limiting effect, a substrate comprising one or more layers and forming a component carrier, or any other carrier, suitable for mounting electronic components thereon, for printing or otherwise producing circuit patterns on the surface thereof, thereby obtaining a printed circuit board, a motherboard, a component board, or similar, or the substrate/carrier may be used for different applications e.g. carry a power module, memory module, a broadband module, etc.

Module in the present context shall be interpreted to include, without being limited thereto, as component carrier as defined above and in accordance with the present invention, or any other printed circuit board, motherboard, component board, or similar, and also including power modules, memory modules, broadband modules, etc.

Electronic assembly in the present context shall be interpreted to include, but without being limited thereto, an assembly comprising two or more modules as defined above, and one module being mounted on the surface of the other module.

BRIEF DESCRIPTION OF THE DRAWINGS

A detailed description of the present invention and embodiments thereof, given as examples only, will now be made with reference to the accompanying drawings, in which.

DETAILED DESCRIPTION OF THE INVENTION

Figure 1:
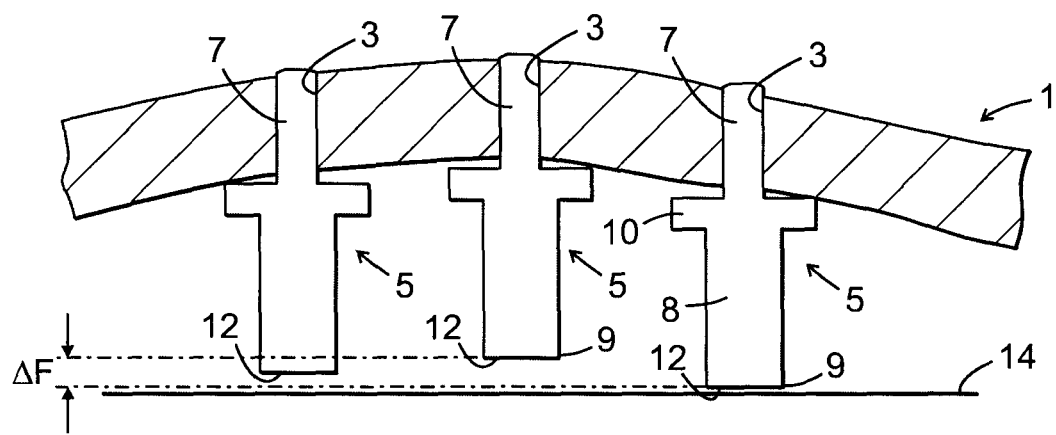
FIG. 1 illustrates, in an enlarged scale and schematically, connection pins mounted in a component carrier.

In FIG. 1 is schematically illustrated a component carrier 1 provided with through-holes 3 for mounting of connection pins 5. The component carrier with its connection pins form a device that is intended to be used as a module in an electronic assembly. Each connection pin has an anchoring part 7, adapted for insertion into and anchoring in said through-hole 3, and a contact part 8, adapted to extend outside said through-hole 3 and having a contact end 9 adapted for contact with the surface of another module of the electronic assembly. The connection pin further includes a flange part 10 adapted to abut against said component carrier and located between said anchoring part 7 and said contact part 8. In the illustrated example, the component carrier 1 is not completely flat or plane, but is slightly curved in relation to a horizontal plane. It should be noted that the curvature in FIG. 1 is grossly exaggerated, for illustrative purposes. The non flatness/planarity of the component carrier can be due to circumstances during any step in the manufacturing process of the component carrier, prior to the mounting of the connection pins. As can be seen from FIG. 1, this will result in that the different connection pins will have respective end surfaces 12, or bottom surfaces, at the contact end 9, which will be at different levels above a flat reference plane 14.

If these differences in levels of the end surfaces 12 remain also after the anchoring of the connection pins to the component carrier, there may occur connection problems between the component carrier with the connection pins and the mating surface on which the component carrier is to be mounted.

If the reference plane 14 corresponds to a mating surface on which the component carrier 1 is to be mounted, for example a PCB, the differences in level between the end surfaces 12 of the respective pins, or their level of co-planarity, also referred to as the flatness or planarity of the device, will be the subject of tolerance specifications. The level of co-planarity is defined as the distance, $\Delta F$, between the end surface of the connection pin being the highest located above the common reference plane 14 and the end surface of the connection pin being the lowermost located above the reference plane 14, or in other words, as the maximum distance between a plane formed by the end surface of any one connection pin and a plane formed by the end surface any other connection pin.

Figure 2A:
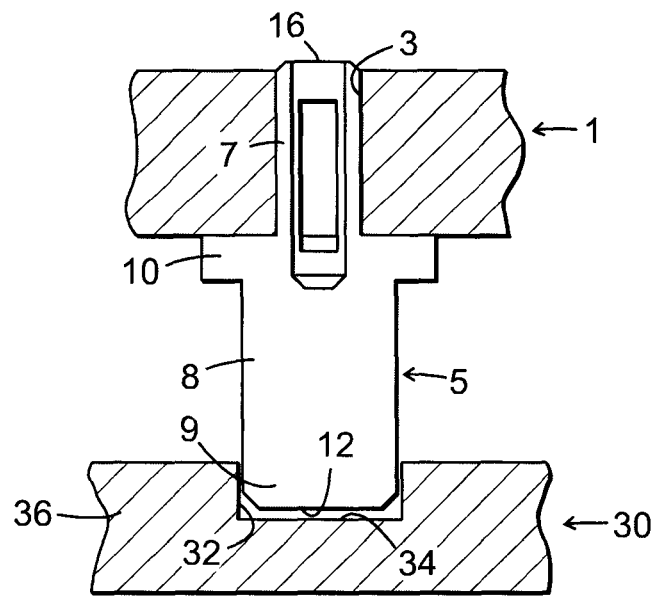
FIGS. 2a and 2b illustrate the method according to the present invention.

In FIG. 2a is schematically illustrated a connection pin 5, inserted in a through-hole 3 of a component carrier 1 by means of the anchoring part 7 of the pin 5. The contact part 8 is located with its contact end 9 in a recess 32 formed in a plate 36 of a die tool 30. The recess 32 has a depth and shape that is adapted to the shape of the contact end 9 of the connection pin, such that the contact end can easily be located in the recess 32, while at the same time the recess 32 functions as a guiding means for the contact end 9 such that the connection pin 5 is adequately supported in the recess during the anchoring operation of the pin in the component carrier 1.

Figure 2B:
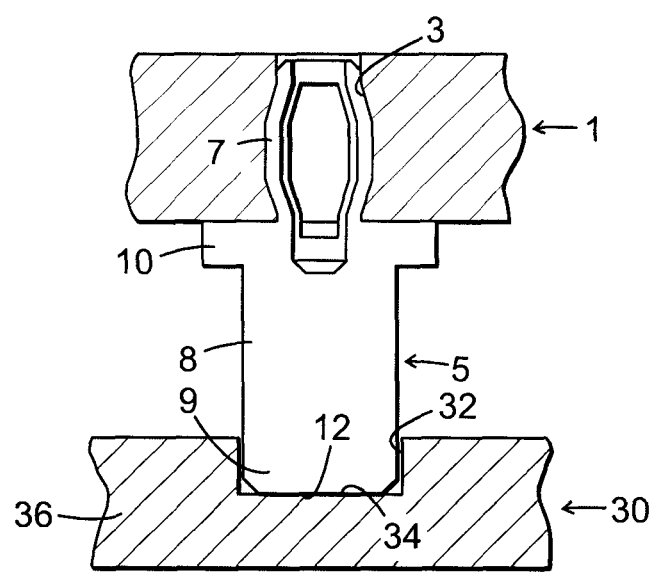

In FIG. 2b is illustrated the connection pin after having been anchored in the component carrier by exerting a force on a free end 16 of the anchoring part 7 of the pin, which force will also press the end surface 12 of the contact end of the pin to abutment against the bottom surface 34 of the recess 32. In the illustrated example, the used connection pin is of a kind that is deformed to a press fit inside the through-hole 3, but other types of connection pins may be used, as explained above.

The bottom surface 34 of the recess 32 has a high hardness that should be sufficient enough to withstand the force exerted on the pin during anchoring of the pin in the component carrier, without any deformation of the surface. The bottom surface should also have a high degree of flatness/planarity. In particular, since the used die tool 30 preferably is provided with several recesses 32, in order to receive and accommodate several connection pins 5 at the same time, the bottom surfaces 34 of all of the recesses should have a high level of co-planarity inbetween them, with a maximum difference of 0.15 mm or less as previously mentioned. By this is meant that if a reference plane is used being a plane formed by the bottom surface of the recess having the lowermost bottom in relation to the other recesses, then any plane formed by the bottom surface of any other recess should be within a distance of 0.15 mm, as a maximum. The tolerance of the recesses is thus 0-0.15 mm, or 0+/−0.075 mm. Even less difference may be possible, e.g. a maximum difference of 0.14 mm, 0.13 mm, 0.12 mm, 0.11 mm, 0.10 mm, 0.09 mm, 0.08 mm or even less, depending on what the requirements are in the specific application.

It is foreseen that a predetermined co-planarity requirement of the connection pins may be in the order of 0.10 mm. As previously explained, in order to successfully obtain a high percentage of connection pins/component carriers fulfilling this requirement, it is foreseen that the co-planarity requirement or tolerance for the recesses may be in the order of 0-0.05 mm, or +/−0.025 mm.

In order to achieve a die tool 30 having recesses 32 with bottom surfaces 34 both as hard as necessary and with the required co-planarity, the material of the tool may for example be a hard stone material, such as marble, or any other material having the required hardness and also being possible to machine to the required level of co-planarity.

Figure 3A:
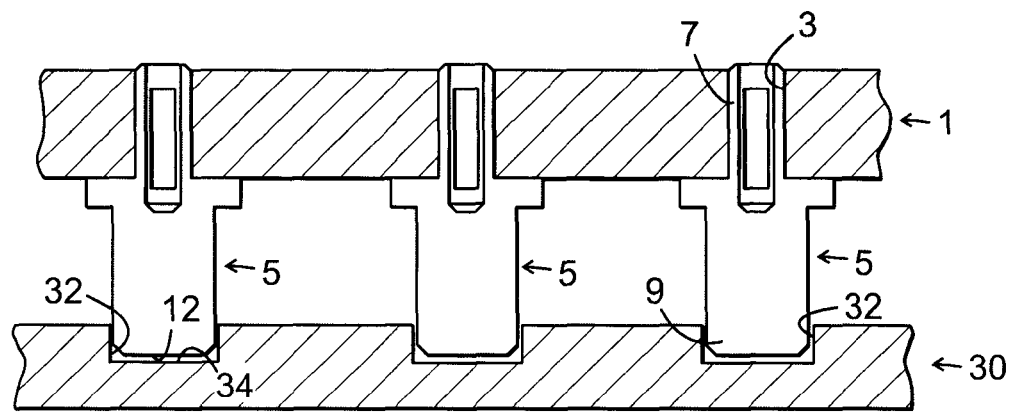
FIGS. 3a and 3b illustrate the method according to the present invention when used for several connection pins simultaneously.
Figure 3B:
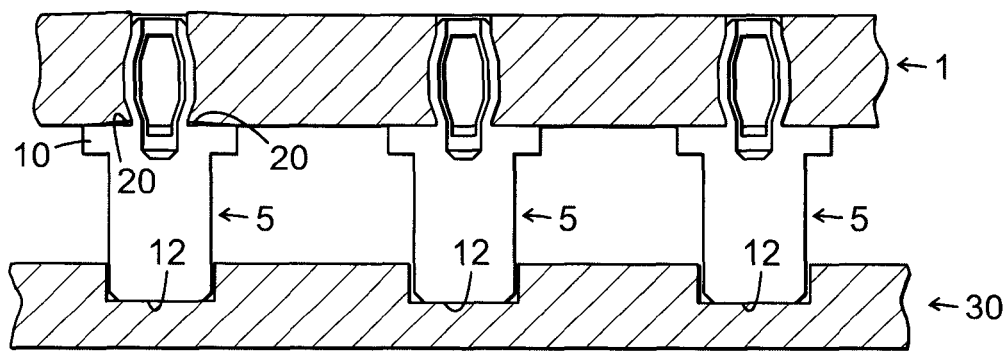
Figure 4:
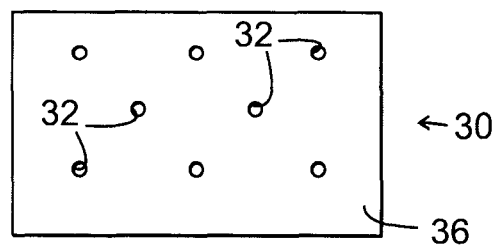
FIG. 4 shows schematically a top view of a die tool according to the present invention.

In FIGS. 3a and 3b is shown an embodiment in which a number of connection pins 5 are anchored in a component carrier 1 in a simultaneous operation. Preferably all of the connection pins that are to be used in a component carrier are simultaneously anchored in the component carrier in one and the same operation. Consequently, there is provided one recess 32 in the die tool 30 for each connection pin 5 of the component carrier 1 on which the tool is to be used. Each such recess in the die tool is located in correspondence with the location of a corresponding connection pin of the component carrier, see also FIG. 4 illustrating the die tool. FIG. 3a illustrates the pins inserted by their anchoring part 7 in respective through-holes 3 in the component carrier 1, and the contact end 9 having been located in a corresponding recess 32 in the die tool, before the anchoring operation is performed. FIG. 3b illustrates the component carrier 1 with the connection pins 5 after the anchoring operation has been performed, which has already been described in connection with FIGS. 2a and 2b. In FIG. 3a can also be seen how the pin to the left, before anchoring, is located higher up in the recess than the two other pins. This is due to the component carrier 1 being slightly curved, which can also be seen from this figure. In FIG. 3b, illustrating the component carrier and pins after anchoring, it can be seen how the end surfaces 12 of the pins are located at what seems to be the same level abutting against the bottom surface of the recess 32. The curved part of the component carrier still exists, but the difference related to lack of co-planarity of the end surface of the pin to the left compared to the other two pins in FIG. 3a has now been transferred to a slight difference located where the pin is anchored in the component carrier. A tiny gap 20 can be seen where the flange part 10 is supposed to abut against the component carrier.

Figure 5:
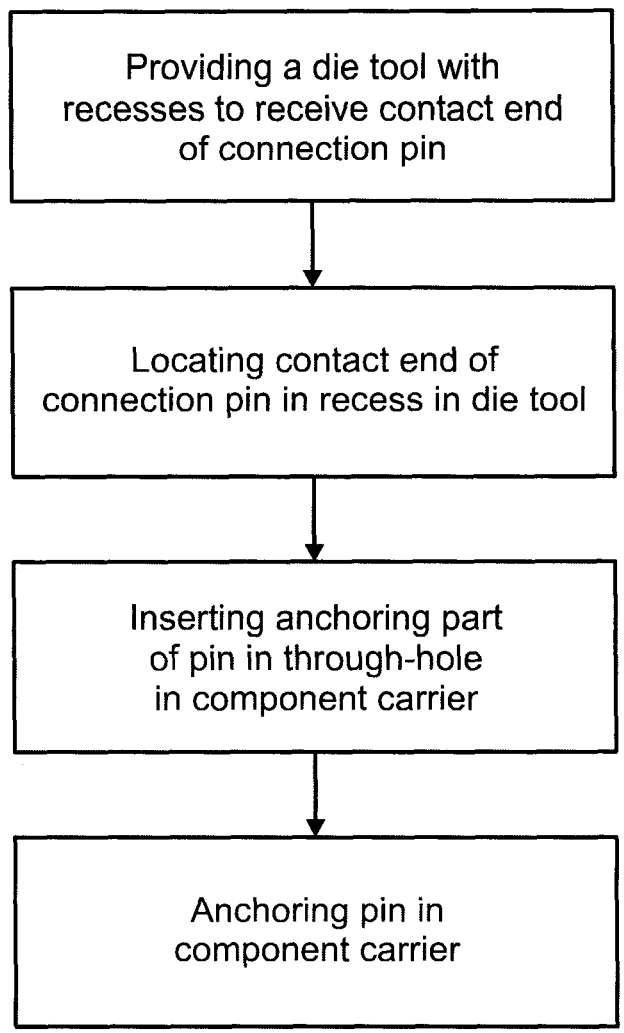
FIG. 5 shows a flow chart illustrating the method according to the present invention.

In FIG. 5 the flow chart shows the different steps of the method:

Step 1: providing a die tool having several similar recesses all adapted to receive a contact end of the contact part of a connection pin, Step 2: locating the contact end of the contact part of a connection pin in a recess provided in the die tool, Step 3: inserting the anchoring part of the pin in a through-hole of the component carrier, Step 4: anchoring the pin in the component carrier by exerting a force on a free end of the anchoring part of the pin while an end surface of the contact end of the contact part abuts the bottom surface of the recess in the die tool, and thereby achieving a high level of co-planarity, with a maximum difference of 0.15 mm between an end surface of the contact end of the contact part of any one connection pin and an end surface of any other connection pin mounted simultaneously in the component carrier.

The method may also comprise additional steps, many related to the electronic assembly of which the component carrier constitutes a module, some of which are always to be performed while others are optional. These additional steps may include:

Removing the component carrier with the connection pins from the die tool,

Mounting and soldering of components on the component carrier; this may be made on the side with the projecting connection pins before mounting of the pins, and on the reverse side after mounting of the connection pins;

Printing or production of circuit pattern by other technique; this may be made on the side with the projecting connection pins before mounting of the pins, and on the reverse side after mounting of the connection pins;

Mounting the component carrier with the connection pins on a mating surface of another module of the electronic assembly;

Soldering of the connection pins to the mating surface and possible additional components.

The present invention shall not be limited to the illustrated examples and embodiments, but may be modified in many ways within the scope of the appended patent claims, as will be recognized by the person skilled in the art.

The invention claimed is:

1. A method for mounting connection pins in respective through-holes provided in a component carrier forming a module for an electronic assembly, each pin having an anchoring part for insertion into said through-hole, a contact part adapted to extend outside said through-hole and having a contact end adapted for contact with the surface of another module of the electronic assembly, and a flange part adapted to abut against said component carrier and located between said anchoring part and said contact part, the method comprising providing a die tool having several similar recesses all adapted to receive a contact end of the contact part of a connection pin, and all recesses having a bottom surface with a high hardness sufficient enough to withstand a force exerted on the connection pin during mounting of the connection pin in the component carrier without deformation of the surface, and the bottom surfaces of all of the recesses having a high level of co-planarity adapted to predetermined requirements for the connection pins, and for each pin:

locating the contact end of the contact part of the pin in a recess provided in the die tool;

inserting the anchoring part of the pin in a through-hole of the component carrier; and anchoring the pin in the component carrier by exerting a force on a free end of the anchoring part of the pin while an end surface of the contact end of the contact part abuts the bottom surface of the recess in the die tool.

2. The method according to claim 1, whereby the anchoring of the pin in the component carrier is caused by deforming the anchoring part of the pin in the through-hole and to provide a press fit of the pin in the through-hole.

3. The method according to claim 1, comprising mounting all of the connection pins of a component carrier at the same time by simultaneously exerting a force on the free ends of the anchoring parts of all of the connection pins, while having their respective contact ends of the contact part of the pin located in a corresponding recess of the die tool.

4. A die tool adapted for mounting connection pins in respective through-holes provided in a component carrier forming a module for an electronic assembly, each pin having an anchoring part for insertion into said through-hole, a contact part adapted to extend outside said through-hole and having a contact end adapted for contact with the surface of another module of the electronic assembly, and a flange part adapted to abut against said component carrier and located between said anchoring part and said contact part, the die tool comprising:

a die having several similar recesses all adapted to receive a contact end of the contact part of a connection pin, all recesses having a bottom surface with a high hardness sufficient enough to withstand a force exerted during anchoring of the pin in the component carrier without deformation of the surface, and the bottom surfaces of all of the recesses having a high level of co-planarity adapted to predetermined requirements for the connection pins.

5. The die tool according to claim 4, wherein the high level of co-planarity of the bottom surfaces of all of the recesses has a maximum difference of 0.15 mm between the bottom surface of any one recess and the bottom surface of any other recess.

6. The die tool according to claim 4, wherein the level of co-planarity of the bottom surfaces of all of the recesses has a maximum difference of 0.10 mm between the bottom surface of any one recess and the bottom surface of any other recess.

7. The die tool according to claim 4, wherein the high level of co-planarity of the bottom surfaces of all of the recesses has a maximum difference of 0.05 mm between the bottom surface of any one recess and the bottom surface of any other recess.

8. The die tool according to claim 4, wherein the recess has a depth and shape adapted to the shape of the contact end of the connection pin, such that the recess guides the contact end during the anchoring operation of the connection pin in the component carrier.

9. The die tool according to claim 4, wherein there is at least provided one recess in the die tool for each connection pin of the component carrier on which the tool is to be used and each such recess in the die tool is located in correspondence with the location of a corresponding connection pin of the component carrier.

10. A component carrier forming a module for an electronic assembly, the component carrier comprising:
    connection pins mounted in respective through-holes provided in the component carrier, each pin having an anchoring part inserted into said through-hole, a contact part extending outside said through-hole and having a contact end adapted for contact with the surface of another module of the electronic assembly, and a flange part adapted to abut against said component carrier and located between said anchoring part and said contact part, wherein the end surfaces of the connection pins form a common plane having a level of co-planarity with a maximum difference $\Delta F$ of 0.15 mm between an end surface of any one connection pin and an end surface of any other connection pin mounted in the component carrier.

11. The component carrier according to claim 10, wherein the level of co-planarity between the end surfaces of said connection pins has a maximum difference of 0.10 mm.

12. An electronic assembly comprising a motherboard forming a first module, and a component carrier as defined in claim 10 forming a second module and mounted on the surface of the motherboard.

13. The component carrier according to claim 10, wherein the through-holes are provided in a non-planar surface of the component carrier.

14. The component carrier according to claim 13, wherein the non-planar surface of the component carrier is curved.

15. The component carrier according to claim 13, wherein a level of co-planarity between portions of the surface of the component carrier at the through-holes is greater than the level of co-planarity between the end surfaces of the connection pins mounted in the respective through-holes.

16. The component carrier according to claim 10, comprising:
    a gap between the component carrier and the flange part of a first one of the connection pins,
    wherein the flange part of a second one of the connection pins abuts the component carrier.

17. The component carrier according to claim 10, wherein the contact end of the connection pins is adapted to be surface mount soldered to the surface of the another module of the electronic assembly.

* * * * *